United States Patent
Martin (10) Patent No.: US 7,364,942 B2
(45) Date of Patent: *Apr. 29, 2008

(54) PROCESS FOR WAFER LEVEL TREATMENT TO REDUCE STICTION AND PASSIVATE MICROMACHINED SURFACES AND COMPOUNDS USED THEREFOR

(75) Inventor: John R. Martin, Foxborough, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/786,515

(22) Filed: Apr. 12, 2007

(65) Prior Publication Data

US 2007/0196945 A1   Aug. 23, 2007

Related U.S. Application Data

(60) Continuation of application No. 10/457,500, filed on Jun. 9, 2003, now Pat. No. 7,220,614, which is a division of application No. 09/771,872, filed on Jan. 29, 2001, now Pat. No. 6,674,140.

(60) Provisional application No. 60/178,958, filed on Feb. 1, 2000.

(51) Int. Cl.
*H01L 21/00* (2006.01)

(52) U.S. Cl. .................. 438/106; 438/57; 438/52; 438/56; 257/E21.261; 257/E21.002

(58) Field of Classification Search ............. 438/106; 257/E21.261
See application file for complete search history.

(56) References Cited

U.S. PATENT DOCUMENTS

| | | | |
|---|---|---|---|
| 3,713,886 A * | 1/1973 | Fulton et al. | 336/223 |
| 4,781,942 A | 11/1988 | Leyden et al. | 427/54.1 |
| 5,061,049 A | 10/1991 | Hornbeck | 359/224 |
| 5,130,265 A | 7/1992 | Battilotti et al. | 437/40 |
| 5,331,454 A | 7/1994 | Hornbeck | 359/224 |
| 5,429,708 A * | 7/1995 | Linford et al. | 216/66 |
| 5,578,863 A | 11/1996 | De Poorter | 257/433 |
| 5,694,740 A * | 12/1997 | Martin et al. | 53/431 |
| 5,766,367 A | 6/1998 | Smith et al. | 134/2 |
| 5,801,309 A | 9/1998 | Carr et al. | 73/514.29 |

(Continued)

OTHER PUBLICATIONS

Favia et al., J. of Polymer Science Part A: Polymer Chem., vol. 32, Issue 1, pp. 121-130, (1994).*

(Continued)

*Primary Examiner*—B. William Baumeister
*Assistant Examiner*—Igwe U. Anya
(74) *Attorney, Agent, or Firm*—Weingarten, Schurgin, Gagnebin & Lebovici LLP (57) ABSTRACT

This invention discloses a process for forming durable anti-stiction surfaces on micromachined structures while they are still in wafer form (i.e., before they are separated into discrete devices for assembly into packages). This process involves the vapor deposition of a material to create a low stiction surface. It also discloses chemicals which are effective in imparting an anti-stiction property to the chip. These include polyphenylsiloxanes, silanol terminated phenylsiloxanes and similar materials.

8 Claims, 5 Drawing Sheets

U.S. PATENT DOCUMENTS

| | | | |
|---|---|---|---|
| 5,822,170 A | 10/1998 | Cabuz et al. | 361/225 |
| 5,904,952 A | 5/1999 | Lopata et al. | 427/8 |
| 5,923,995 A * | 7/1999 | Kao et al. | 438/460 |
| 5,936,758 A | 8/1999 | Fisher et al. | 359/224 |
| 5,950,101 A | 9/1999 | Yano et al. | 438/618 |
| 6,063,714 A | 5/2000 | Smith et al. | 438/778 |
| 6,265,026 B1 * | 7/2001 | Wang | 427/248.1 |
| 6,287,430 B1 | 9/2001 | Matsumoto et al. | 204/192.26 |
| 6,335,224 B1 * | 1/2002 | Peterson et al. | 438/114 |
| 6,358,771 B1 | 3/2002 | Martin et al. | 438/106 |
| 6,379,988 B1 * | 4/2002 | Peterson et al. | 438/51 |
| 6,969,635 B2 * | 11/2005 | Patel et al. | 438/107 |
| 7,220,614 B2 * | 5/2007 | Martin | 438/57 |

OTHER PUBLICATIONS

Parylene Coatings, by Beach et al., pp. 789-801 in Electronics Materials Handbook; vol. 1, Packaging, Minges et al., Eds, ASM International (1989).

Oct. 4, 2000—Slide presentation by J. Martin to American Vacuum Society Meeting, Boston, MA (abstract included).

Oct. 9, 2000—Slide presentation by J. Martin to Worcester Polytechnic Institute, Worcester, MA (abstract included).

Mar. 14, 2000—Slide presentation by J. Martin to National Institue of Standards and Technology, Gaithersburg, MD.

Handbook of Electronic Package Design, Edited by Michael Pecht, CALCE Center for Electronic Packaging, University of Maryland at College Park, Maryland, Marcel Dekker, Inc., copyright 1991, pp. 21-23 and pp. 767-772.

* cited by examiner

HEXAPHENYL CYCLOTRISILOXANE

SILANOL TERMINATED
POLYDIPHENYLSILOXANE

OCTAPHENYL CYCLOTETRASILOXANE

HEXAPHENYL DISILOXANE

Ph = phenyl (⬡)

HEXAMETHYL DISILAZANE (HMDS)

PROCESS FOR WAFER LEVEL TREATMENT TO REDUCE STICTION AND PASSIVATE MICROMACHINED SURFACES AND COMPOUNDS USED THEREFOR

CROSS REFERENCE TO RELATED APPLICATIONS

This application is a continuation of U.S. patent application Ser. No. 10/457,500, filed Jun. 9, 2003 now U.S. Pat. No. 7,220,614 which is a divisional of U.S. patent application Ser. No. 09/771,872, filed Jan. 29, 2001 now U.S. Pat. No. 6,674,140 which claims priority from U.S. Provisional Patent Application Ser. No. 60/178,958, filed Feb. 1, 2000, which is incorporated in its entirety herein.

BACKGROUND OF THE INVENTION

Micromachined sensors and actuators (sometimes referred to as microelectromechanical systems or MEMS and micro-opto-electro-mechanical systems or MOEMS) are made using semiconductor technologies so these microstructures have very clean surfaces. Inorganic surfaces that are extremely clean tend to stick together if they come into contact. If microstructure surfaces stick, the device becomes defective. One example of such a component is the class of inertial microsensors that measures acceleration and deceleration (e.g., an accelerometer), and an example of one of these is the sensor which determines whether an automobile is colliding and the air bag should be deployed. Another example is a gyroscope. A third example, representing non-inertial micro-structures, is a micro-mirror array such as that used in optical communications and projection systems.

The airbag sensor has a sub-component which moves in response to the inertial changes that arise during rapid deceleration. The failure of this subcomponent to move during deceleration can be caused by the sticking of this micro-subcomponent to other components in its immediate environment. This concept of sticking is called "stiction", and the concept of preventing sticking from occurring is called "anti-stiction".

There has been some prior development of anti-stiction treatments that are applied during assembly and packaging. For example, U.S. Pat. No. 5,694,740 (hereafter referred to as '740) describes the vapor deposition of various organics, including silicones, alkoxysilanes and perfluoroethers, to the component during assembly. Although this treatment reduces stiction, it is not efficient to treat each individual component, since these electronic components are extremely small, and large numbers of these components are manufactured at one time. Fluorocarbons, also applied during assembly, have been used as anti-stiction treatments for micro-optical devices (based on the concept of a light beam being deflected by a moving mirror) in U.S. Pat. No. 5,936,758.

Anti-stiction treatments normally "passivate" the surface and are called passivants. That is, they alter surfaces to make them less interactive with their surroundings.

BRIEF SUMMARY OF THE INVENTION

This invention discloses a process for forming durable anti-stiction surfaces on micromachined structures while they are still in wafer form (i.e., before they are separated into discrete devices for assembly into packages). This process involves the vapor deposition of a material to create a low stiction surface. It also discloses chemicals which are effective in imparting an anti-stiction property to the chip. These include phenyl alkoxysilanes, polyphenylsiloxanes, silanol terminated phenylsiloxanes and similar materials.

DETAILED DESCRIPTION OF THE INVENTION

The chemical bond between atoms in solid inorganic materials usually has substantial ionic character. These materials may have a defined stoichiometry and microstructure, but they do not form distinct molecules. In contrast, the chemical bonds in organic materials are primarily covalent and produce discrete molecules. As a result, clean inorganic surfaces have a high surface energy. This causes them to be susceptible to stiction and to readily adsorb gases from ambient environments. Covalently bonded molecules on organic surfaces have much lower surface energies so these surfaces have relatively low stiction and gas adsorption. The process and specific materials described in this patent produce a silicon oxide surface that is enriched with organic phenyl groups. These phenyl groups are chemically reacted into the oxide and produce the desired results because they reduce surface energy. As a class, organic, materials have lower surface energy than inorganic materials. Thus, it is apparent that other organic materials which can be deposited in a vaporization process (in addition to silicone compounds) will also produce effective anti-stiction and passivation characteristics when deposited in this process. Use of silicon oxide as the "carrier" for the phenyl groups is not required. However, it has unusual value for semiconductor applications because, to the extent that the molecules degrade, they simply form silicon dioxide, a well-understood semiconductor material. This patent is described in terms of phenyl rich surfaces because this particular organic group has outstanding thermal and oxidation stability, characteristics that allow the treatment to survive semiconductor packaging processes with minimal change. High deposition temperature causes more complete removal of weakly bonded adsorbed species. This type of treatment promotes strong primary chemical bonds between the clean reactive surface and the organic anti-stiction vapor, resulting in surface characteristics that are very stable.

The aromatic nature of phenyl groups delocalizes energy. This characteristic gives phenyl groups better thermal stability than other organics. It also improves wear resistance, an important factor in microstructures that must sustain repetitive or long duration contact between surfaces.

In the early years of the semiconductor industry, circuit devices often exhibited erratic electrical behavior. One source of this problem was surface effects caused by adsorption of atmospheric vapors onto high energy oxide surfaces. Sealing the surfaces with an inorganic passivant such as silicon nitride solved this problem. This invention illustrates the use of vapor deposited organic surfaces as an alternative passivation technique. It improves electrical stability even when the organic layer is only 5-100 Angstroms thick. The low energy of this organic surface layer greatly reduces adsorption of atmospheric gases, a beneficial characteristic in some applications.

Organics have been used to passivate semiconductor wafers in special applications. One example is the class of polyimide coatings that are deposited from liquids. A second example is the class of vapor deposited poly(p-xylylene) films. Neither has been shown to be capable of forming sub-100 Angstrom passivation layers in a controllable process. This is an important distinction because organics are dielectric materials. They support surface charges unless they are extremely thin. Such charges can dramatically affect the parametric performance and the reliability of MEMS devices.

In summary, the principles used to achieve antistiction qualities in this invention also impart wear resistance, suppress adsorption and improve electrical stability in many applications.

Obviously, a process that deposits a defined organic rich layer with a well-defined thickness and refractive index also has potential optical and biotechnology applications. One limitation in some applications is the deposition temperature. Anti-stiction and passivation characteristics have also been demonstrated when lower temperatures were used to react vapors of methyl alkoxysilanes, phenyl alkoxysilanes, diphenylsilanediol, methylphenylsilicones and hexa-methyldisilazane (HMDS) with the surface of wafers that contain microstructures. Note that none of these materials contain chlorine or chlorides, an important factor in the manufacture of semiconductor wafers that contain aluminum, because aluminum is readily corroded by trace amounts of chloride when moisture is present. One of these materials, HMDS, is used in the semiconductor industry to improve adhesion between resists and wafers. The use described in this patent has the opposite effect; it decreases adhesion between mating surfaces when they come into contact.

This invention does not preclude the use of materials that contain chlorine because such materials are routinely used in semiconductor processes that are not affected by undesired side effects such as the aluminum example noted above.

Micromachined devices have many applications. Specific applications can require one or more of the following: good anti-stiction properties, controlled surface electrical properties, suppression of adsorption on the surface of said device, control of adsorption on the surface of said device, and wear resistant properties on at least one surface of said device.

Although the discussion in this application concentrates on sensors used in airbags, the concepts being discussed apply to all micromachined structures that must remain separated. The chips that result from the manufacturing process discussed herein are frequently used in cerdips (ceramic dual in-line packages) and cerpacs. Cerpacs are a variant of cerdip packages in which the leads are formed such that they can be soldered onto surface mount substrates. Both cerdips and cerpacs use rectangular ceramic bases that have a cavity in which a chip is mounted. The periphery of the cavity is a flat surface that is coated with seal glass. A metal lead frame is embedded into the seal glass when aligned leadframes and bases are passed through a furnace. During this furnace pass, the seal glass on the base softens and bonds to the leadframe. Often, this furnace pass is also used to burn out organics and sinter the inorganics in silver-glass die attach that is used to mount chips in the cavities. After wire bonding the chips to the leadframes, ceramic lids are placed over the base-leadframe assemblies. The lids also have surfaces covered with seal glass to match the seal surface on the base. Passing lid-leadframe-base assemblies through a furnace softens the seal glass on both bases and lids. The high furnace temperature causes the glass to flow and create hermetic seals around the cavities that contains the chips. Thus, typical cerdip/cerpac manufacturing processes include several furnace passes. The furnace conditions used in standard industrial processes, commonly about 430°-460° C. in air, quickly degrade organics. For that reason, cerdips and cerpacs seldom contain organic materials.

This application describes primarily micromachined structures fabricated on silicon wafers to illustrate the invention. However, as described above, the invention has broader applicability. It recognizes that stiction arises from the high surface energy that characterizes clean inorganic materials. Consequently, a vapor treatment that creates thin organic surfaces on any inorganic microstructure (even microstructures fabricated from inorganic materials that are not normally considered to be semiconductors) will reduce surface energy and thus suppress stiction. Quartz, a crystalline silicon oxide, is an example of such a material. It has been used in microstructure applications that utilize its piezoelectric properties to produce resonant and surface-sensitive microstructures.

The preceding paragraph describes the broad application of surface energy suppression in terms of stiction. However, similar descriptions apply to other surface effects discussed herein, including surface wear, adsorption and electrical properties.

The examples used in this application are based on polysilicon microstructures on silicon wafers. However, it is apparent that the invention is applicable to clean inorganic microstructures on any substrate. Therefore, the term wafer, as used in this application, includes any clean inorganic substrate that contains at least one inorganic microstructure.

This invention is described as it is used on wafers in one preferred embodiment. In this embodiment the chips on the wafers have at least one inertial sensor that is integrated with electronic circuitry on the chip, and subsequently packaged in cerdips and cerpacs. However, the invention is similarly applicable to chips that have micromachined devices without integrated electronic circuitry, and to packages other than cerdips and cerpacs. For example, many standard integrated circuit (IC) devices are packaged in leadless chip carriers (LCC) at temperatures below 350° C. in nitrogen. LCC packages are also cavity packages. The base is usually ceramic and the lid is usually a metal whose coefficient of thermal expansion is similar to the base. In the LCC assembly process, devices are typically mounted in the base using either a low temperature silver-glass or an organic die attach product. When silver-glass is used, the parts normally pass through a furnace in air at about 350° C. Process temperatures with organic die attach materials are lower and nitrogen is normally used to minimize degradation. After wire bonding the chip bond pads to the connection points on the bond shelf in the cavity, the lid is solder or seam sealed to the base, thus protecting the chip and allowing it to be electrically connected to a surface mount substrate.

Plastic packages are also common. In standard plastic packaging processes, chips are mounted on metal leadframes with a die attach material that is usually organic. Electrical connections between bond pads on the chips and lead fingers on the leadframe are typically made by ball bonding gold wire between the bond pads and the fingers. This array of mounted devices is placed in a mold where a liquid plastic compound flows over each device at high pressure and encapsulates them. Chips with micromachined devices can be molded in these plastic packages if the microstructures are capped in order to protect them from the flowing plastic. Plastic process temperatures are typically only 175° C., considerably lower than cerdip and cerpac processing temperatures (the technique used to apply the caps may require temperatures considerably higher than 175° C. if metal or glass is used to bond the caps over the micromachined device). Obviously, other packaging methods, including bare chip and flip chip mounting are also possible, provided that suitable precautions are taken to shield the microstructures from particles, physical damage and other deleterious effects which may occur during handling and use. This packaging discussion shows that alternatives to cerdip and cerpac packaging are possible and that some of these implementations are less hostile to the organic treatments described in this invention. The aggressive nature of cerpac and cerdip processes can also be ameliorated by using seal glasses which soften at lower temperatures, and by mixing the air used in the Assembly furnaces with an inert gas to reduce high temperature oxidation. For example, a 6 to 1 ratio of nitrogen to air reduces the oxygen content of the hot furnace gas from 21% to 3%. This dilution, when used in the cerdip and cerpak high temperature furnaces, reduces oxidation of the surface treatment without significantly impacting the die attach, leadframe and package seal processes. This discussion of packaging technologies based on processes that are less aggressive broadens the applicability of this invention. Whereas, treatments which form phenyl based coatings are most desirable in standard cerdips and cerpacs, surface treatments based on other organics can be used when the packaging process is less hostile.

Figure 1:
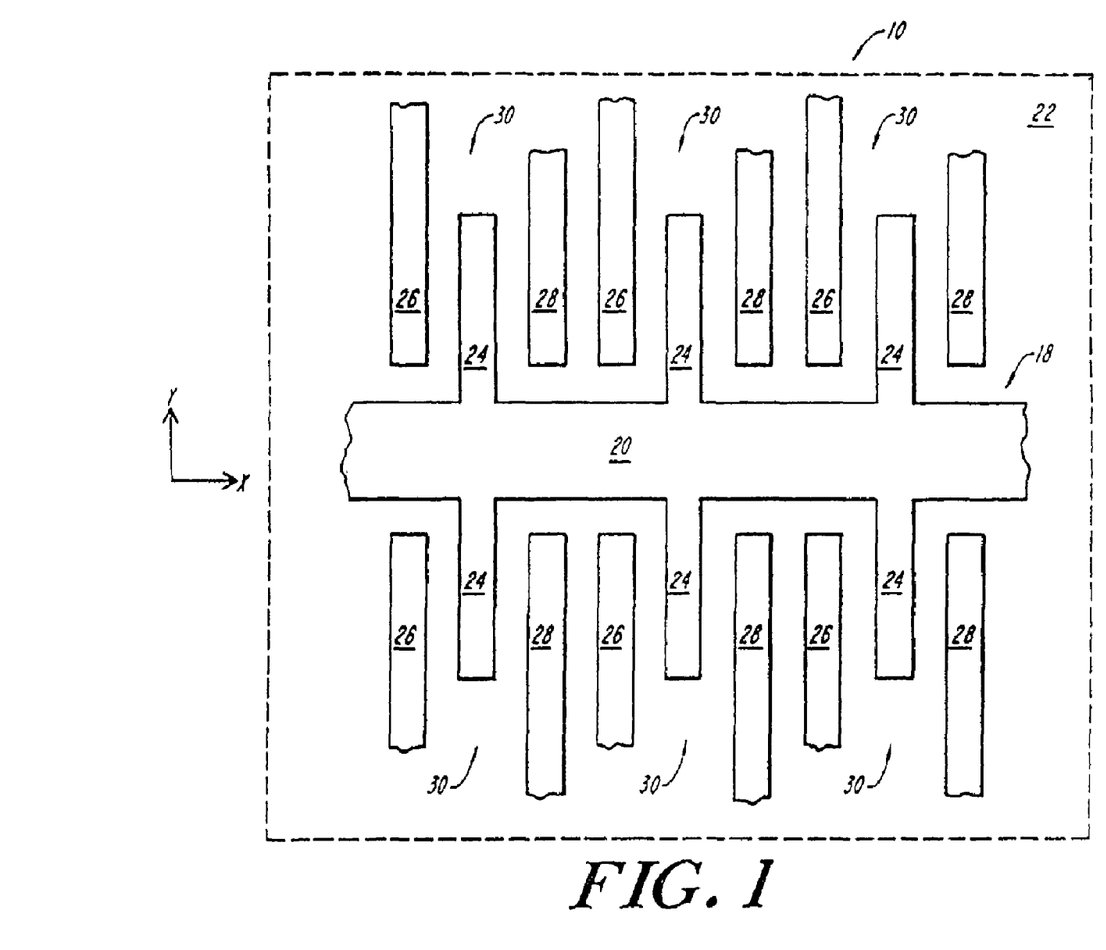
FIG. 1 shows a typical micromachined device (accelerometer).

An illustration of a typical micromachined accelerometer is shown in FIG. 1, which shows the general shape of a single axis Analog Devices, Inc. accelerometer. The interdigitated fingers in FIG. 1 (24, 26 and 28) are normally separated from each other and from the underlying substrate by less than two microns. Some of them are also part of a spring mounted mass that has high mechanical compliance. Therefore, if the device is subjected to high mechanical or electrical shock forces, microstructures can contact adjacent surfaces. The device normally recovers without damage when the surfaces separate. However, performance is degraded if the surfaces stick.

Figure 2:
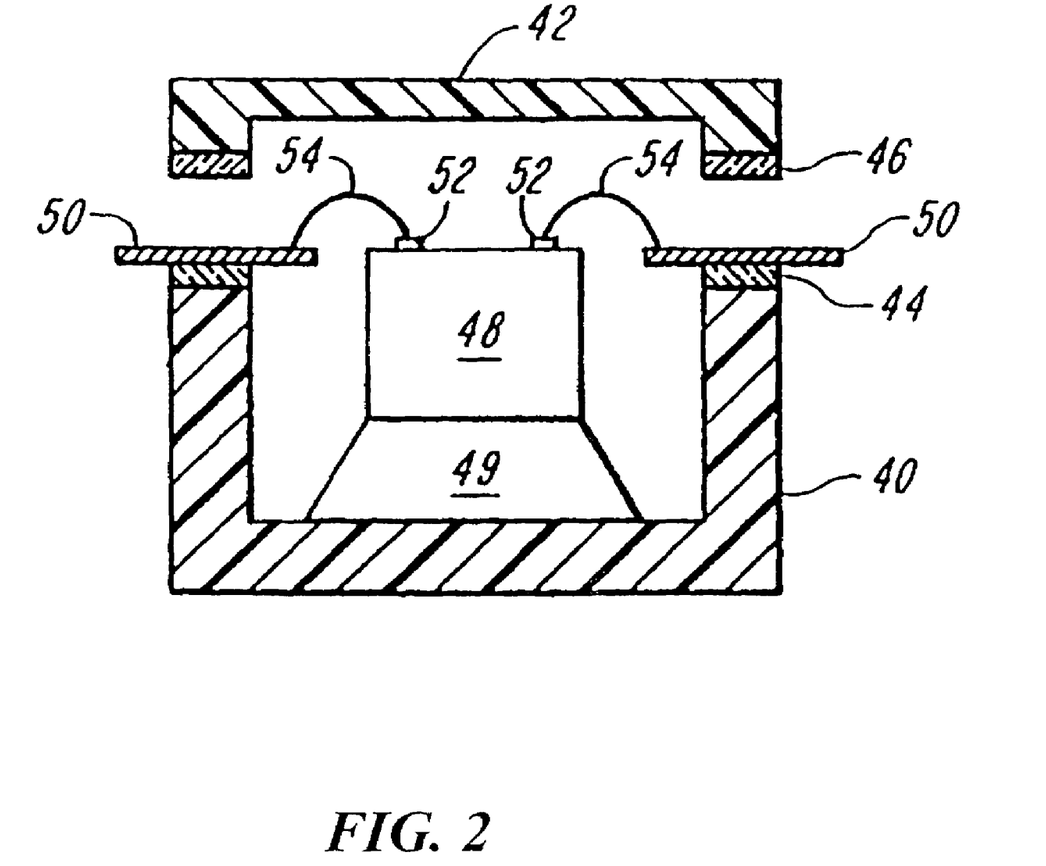
FIG. 2 is a cross-sectional view of a cerdip or cerpac containing a semiconductor device prior to being sealed.

FIG. 2 is a cross-sectional view of a cerdip or cerpac containing a semiconductor device prior to being sealed. (FIGS. 1 and 2 are described in further detail in U.S. Pat. No. 5,694,740, which is incorporated herein in its entirety by reference.)

In order to understand the magnitude of the stiction problem, one needs to understand the basic principles of chip manufacturing. The manufacture of typical IC chips is very expensive because it requires a sequence of several dozen steps involving the deposition, implantation, removal and patterning of special materials under conditions of extreme purity. Therefore, to be cost effective in many applications, the devices must be small (often less than a few square millimeters). This allows the manufacturer to make several thousand devices from each wafer, and up to several dozen wafers can be made in a wafer fabrication lot. Thus, any treatment at the wafer stage, wherein the benefit can be delivered simultaneously to the several thousand chips, rather than having to treat each chip individually, makes the process more efficient and economical. Obviously, the measure of cost effectiveness is a function of the value that a device adds to an application. For example, a highly reliable micro-mirror switch array adds very high value to communication systems so large arrays can be cost effective even if only one or two devices can be placed on a wafer. (Thus, in some cases, the wafer is not cut into chips, but the entire wafer is used for one device.) It has been discovered herein that integrating an anti-stiction process into the wafer fabrication flow can prevent stiction in the resulting chip. The acronym WASA (Wafer Anti-Stiction Agent) is sometimes used to describe this process and the coating material.

Work has been published on wafer level treatments to suppress in-process stiction of microstructures. In-process stiction occurs during wafer processing immediately after the structures are "released". In contrast, the present invention is applied to wafers that contain microstructures that have already been released and are functional, in air or some other gaseous environment. This distinction is further discussed in the following paragraph.

Microstructures are often made by depositing thin films over a sacrificial layer on wafers. Silicon-on-insulator and various techniques that bond wafers together are also used. After patterning, the sacrificial material is commonly removed (i.e., "released") in a process that uses liquid etchants and rinses. As the liquid dries, surface tension draws the microstructures into contact, where they stick unless anti-stiction treatments or some other preventative technique are used. Unfortunately, surface treatments optimized for in-process stiction have limited thermal and oxidative stability so they do not adequately survive high volume hermetic packaging processes. Treatments that form long chain alkyl groups on the microstructure surfaces are an example of this limitation. Some surface treatments are also based on chlorosilanes. Chlorosilanes raise reliability concerns because chloride residue on aluminum interconnects and bond pads can cause corrosion failures. These concerns were avoided in '740 by using a chloride-free material that has high thermal and oxidative stability, and, by applying it near the end of the assembly process. In '740, an organic liquid is dispensed into cavity packages that contain chips with microstructures. The packages are then heated to volatilize the liquid. Almost all of the liquid evaporates into the furnace. However, as the vapor leaves the cavity, it contacts the surfaces of the chip and forms a thin organic layer on the microstructures. Such a treatment provides effective anti-stiction. However, one preferred embodiment requires matching the liquid vaporization characteristics to the thermal profile, controlled dispensing of small liquid quantities and requires that the treatment be used on individual devices rather than on wafer lots. Thus, it loses the economic and process control advantages that characterize wafer scale processes. This patent application discloses techniques for imparting the anti-stiction property to microstructures on these wafers, said techniques avoiding the above limitations.

Although '740 disclosed materials that worked well when applied during the assembly process, and these materials provide some benefit when applied during the wafer manufacturing stage, it should be recognized that there are several steps wherein the chip is handled from the time the wafer is manufactured until the chips are assembled in the electronic component, and these steps expose the chips to changes in temperature (as high as 500° C.), different chemical environments, physical abuse during handling and other activities and forces which, understandably, have some impact on the manufacturing yield of devices which meet the product performance requirements. In addition, a further disclosure in this application relates to anti-stiction treatments which work much better than those disclosed in '740 when they are applied during the wafer manufacturing stage. It should be noted that these new anti-stiction coatings also provide benefit when applied to the component during assembly.

Figure 3:
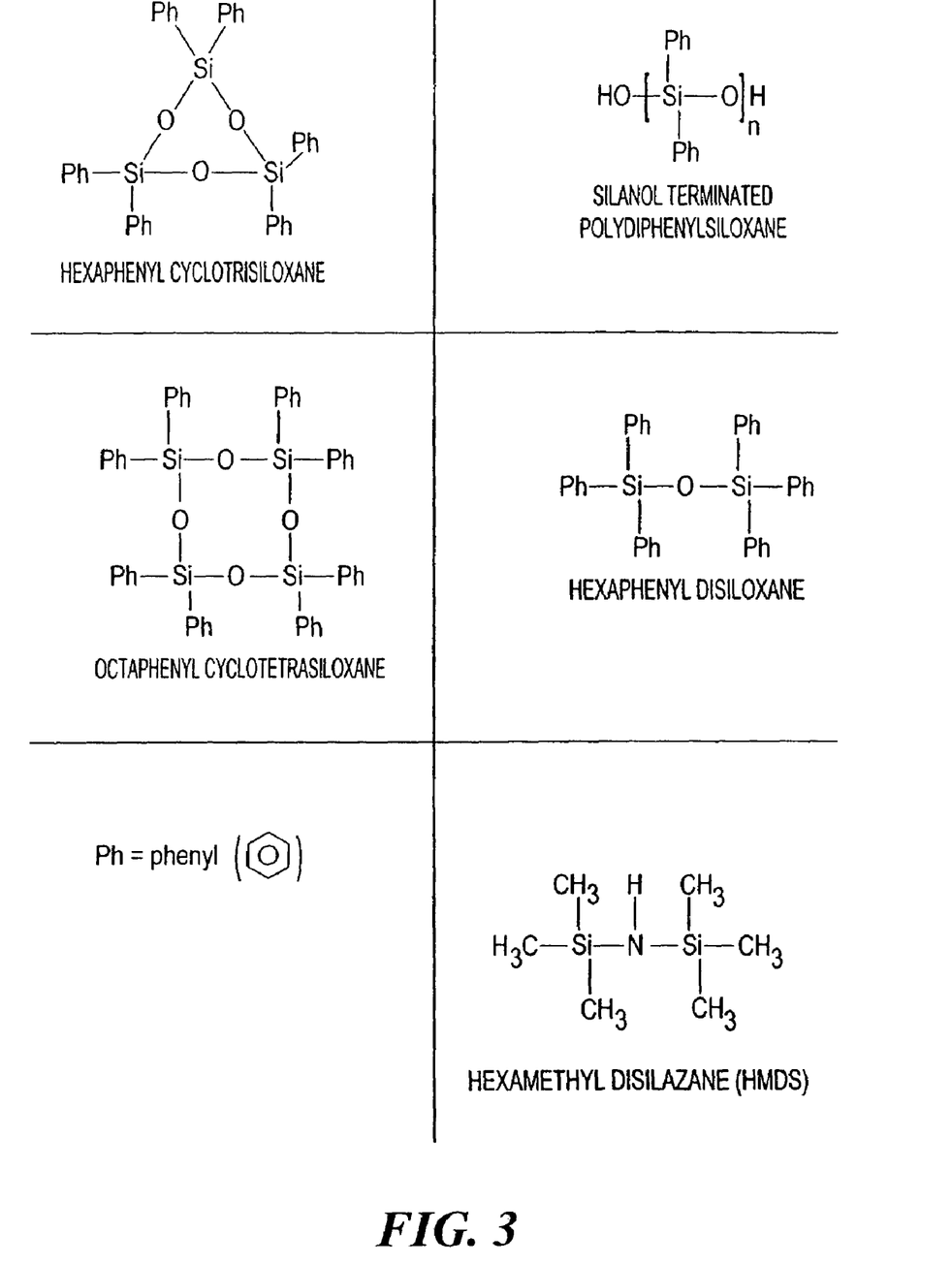
FIG. 3 shows the chemical structure for several of the compounds disclosed herein.

The terminology regarding organo silicon compounds (organic compounds that include silicon) as used in this application is as follows. The organo silicon compounds must have at least one Si—R group in the molecule (R is the general representation for an organic group). Silanols, chlorosilanes and alkoxy silanes are organo silicon compounds in which one or more of the substituents attached to the silicon atom(s) in the molecule is a hydroxide (—OH), a chloride (—Cl) or an alkoxide (—OR), respectively. Silicones (also called siloxanes) are synthetic polymers containing (—Si—O—) repeating units, and the silicon atom in these repeating units can have up to 2 substituents, which can include, for example, phenyl (—Ph) and methyl (—Me) groups. In this application, the terms phenylsilane, phenylsiloxane and phenylsilicone refer to compounds that have at least one phenyl group on at least one silicon atom. Examples include silanol-terminated polydiphenylsiloxane, diphenylsilanediol, tetraphenyldisiloxanediol, hexaphenyldisiloxane, tetramethylphenyldisiloxane, hexaphenylcyclotrisiloxane, octaphenylcyclotetrasiloxane, triphenyl silane and triphenylsilanol. Much of the discussion in this application uses diphenylsiloxane materials to illustrate the invention. However, all such discussions should be considered as examples of the broader phenylsilane and phenylsiloxane family. Methylphenylsiloxanes and methylphenylsilicones are compounds that contain at least one methyl and at least one phenyl substituent in the molecule. An example is 1,1,3,5,5-pentaphenyl-1,3,5-trimethyl-trisiloxane. Examples of alkoxy compounds include methyltrimethoxysilane, phenyltrimethoxysilane, diphenyl-methylethoxysilane and diphenyldiethoxysilane. Note that diphenylmethylethoxysilane is a methylphenyl alkoxysilane. Examples of silanols include diphenylsilanediol, tetraphenyldisiloxanediol and silanol-terminated polydiphenylsiloxane. As used in this application, the term silane includes compounds that contain at least one organic group, at least one silicon atom and at least one other substituent, which is likely to be either hydrogen, chlorine, an alkoxy group or a hydroxyl group. Triphenylsilane, diphenyldimethoxysilane and diphenylsilanediol are examples of this usage. Terminal silicon atoms in a silicone can have 3 substituents, which are likely to be phenyl, hydroxide or methyl groups. Several representative compounds are illustrated in FIG. 3.

Silanes having alkoxy substituents were used in the '740 patent to impart anti-stiction properties to open cerdips during the assembly process. Deposition at this point in the manufacturing process (i.e., after the wafer was cut) minimized thermal and oxidative degradation. The alkoxysilanes used included both methyl and phenyl alkoxysilanes. Those compounds containing phenyl substituents were much more difficult to handle, since they had lower vapor pressure at room temperature. No silanes or siloxanes containing only phenyl substituents have been evaluated on wafers in the past for anti-stiction properties.

Phenylsiloxanes are more thermally stable than methyl siloxanes and are more likely to survive the assembly processes involved in chip manufacture. Also, reports in the scientific literature indicate that the cyclic siloxanes are more heat stable that the comparable linear ones. However, investigations leading to this invention show that surfaces treated with chemically reactive diphenyl siloxanes have greater thermo-oxidative stability than those treated with comparable cyclic siloxanes. This conclusion is based on performance testing of devices packaged in cerdips and cerpacs. In this context, examples of chemically reactive siloxanes and silanes include products with hydroxy, alkoxide or hydrogen functionality. This performance distinction between reactive and non-reactive siloxanes can be less significant when the device is packaged in plastic or in hermetic packages that are solder or seam sealed because these packaging processes are less aggressive than the cerdip and cerpac processes.

Figure 4:
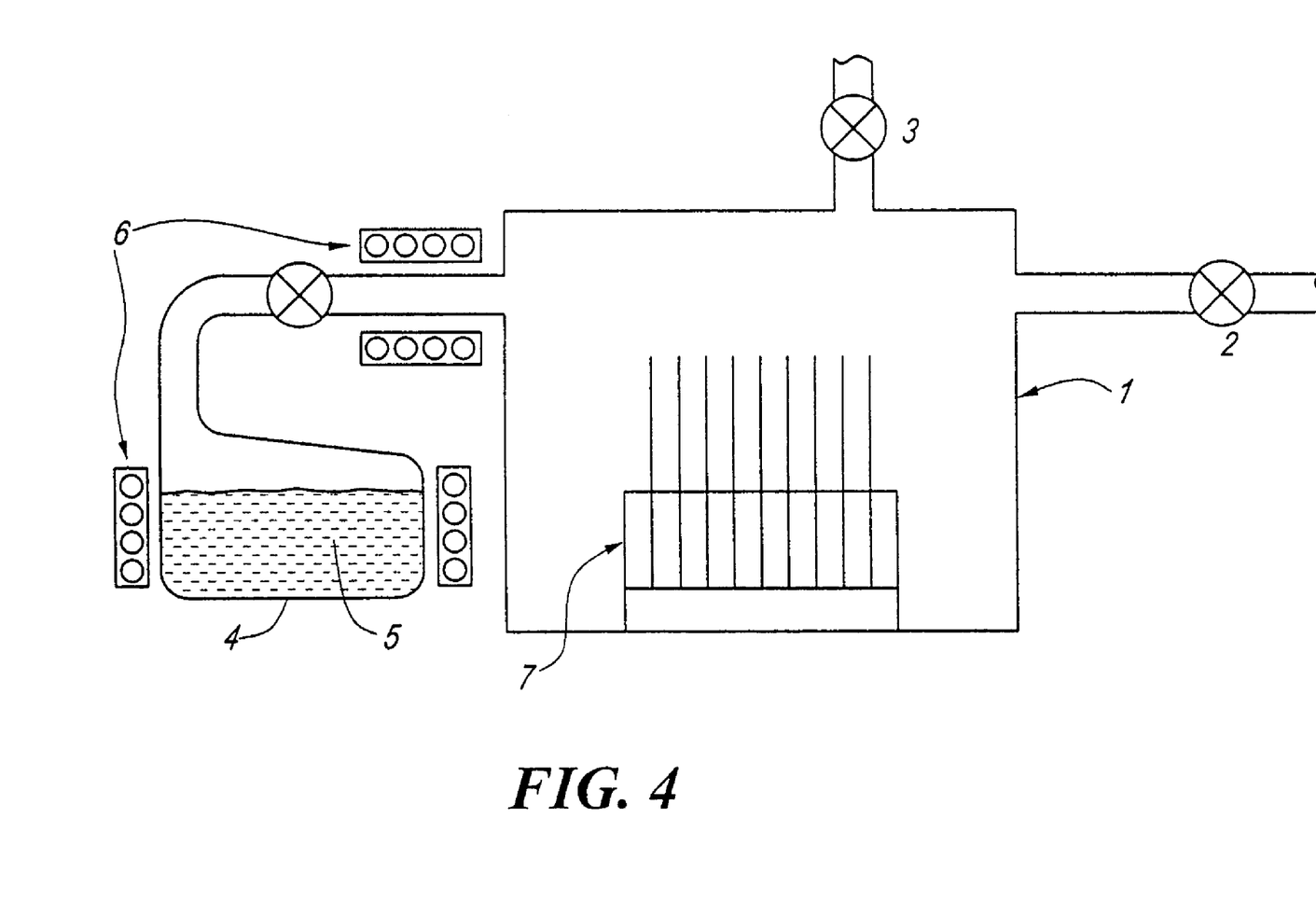
FIG. 4 shows a schematic view of an oven used for vapor deposition of a liquid anti-stiction agent.
Figure 5:
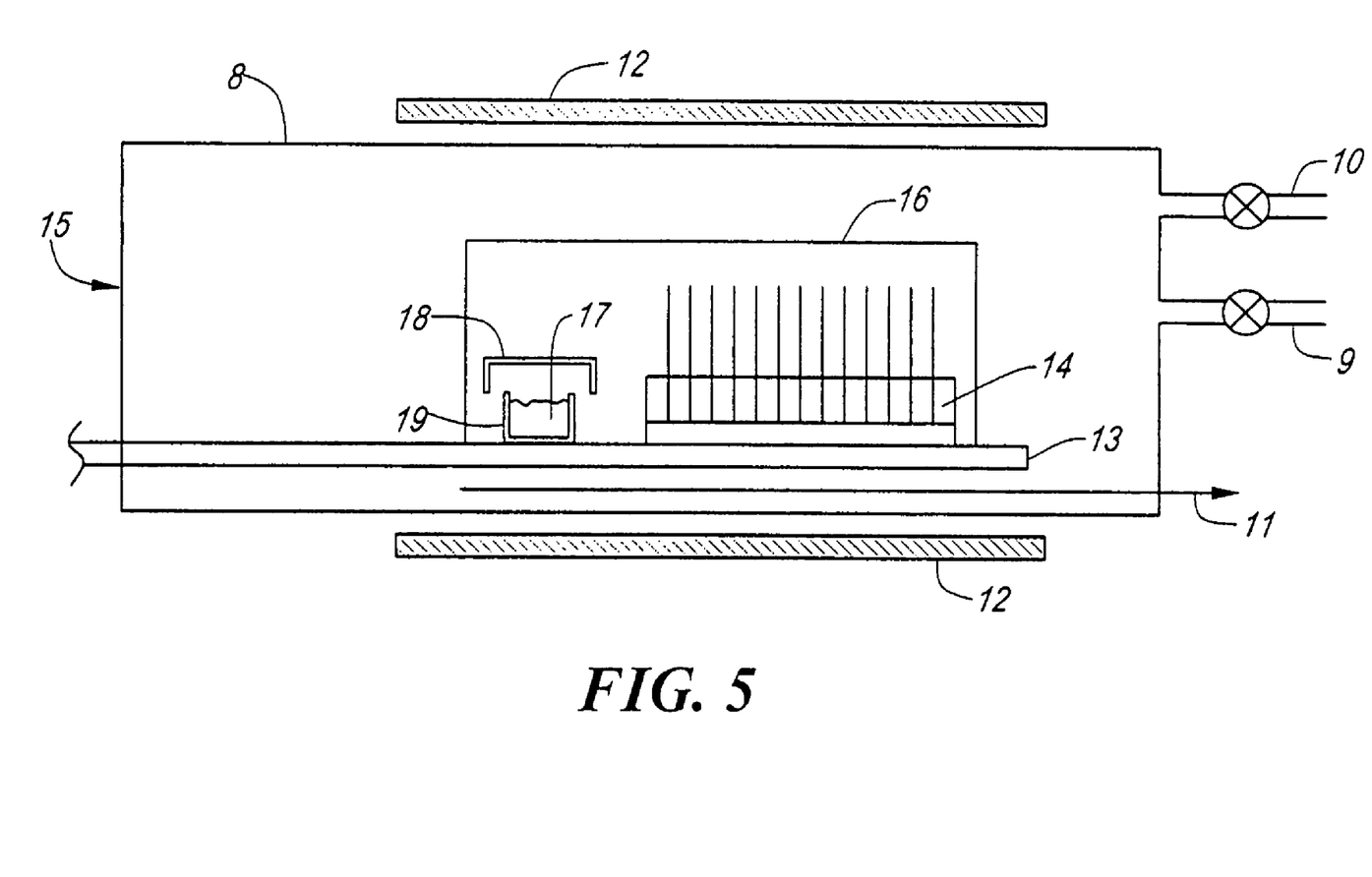
FIG. 5 shows a schematic view of a CVD furnace tube used for vapor deposition of a solid anti-stiction agent.

Two variations of ovens used to heat the treated wafers are shown in FIGS. 4 and 5. The Modified Vapor Prime Oven 1 (FIG. 4) is capable of drawing a vacuum (through vacuum valve 2, which is connected to a vacuum pump. Nitrogen or some other relatively inert gas can be fed into the oven via gas inlet valve 3. The oven also has connected thereto a reservoir 4 containing the coating material 5, which can be a liquid or solid at room temperature, and the reservoir may have one or more heat sources 6 to vaporize the coating material and to maintain it in vapor form in its passage from the reservoir to the oven. The Oven can also contain a device (such as a computer) for programming the temperature, gas pressure, etc. of the oven. The oven in FIG. 4 is shown with wafers positioned in a wafer boat 7.

A typical CVD furnace 8 is shown in FIG. 5. This furnace also has a vacuum source 9, a source of nitrogen or another relatively inert gas 10, a thermocouple 11, one or more heaters 12, and a stand 13, for supporting the materials to be treated. This stand is often called a paddle. The wafers in wafer boats 14 are placed in enclosure 16, which is not vacuum-tight, and covered. The paddle holding enclosure 16 is then advanced through door 15, which is then closed. Enclosure 16 is used to maintain a high localized concentration of vapor. Note that the coating material 17 is placed in a container 19, which is also within the enclosure, said container shown with a shield 18 to suppress splattering.

Obviously, alternative materials have different vapor pressures so the deposition temperature range can be adjusted when different materials are used in order to maintain equivalent deposition rates. This would be a consideration, for example, when either diphenyl-silanediol or tetraphenyl-disiloxanediol is used as the deposition material rather than octaphenyltetra-cyclosiloxane or silanol terminated polydiphenylsiloxane. Diphenylsilanediol is the smallest molecule in the family of silanol terminated polydiphenylsiloxane. It has a molecular weight (216) that is much less than that of octaphenylcyclotetrasiloxane (793) so it is obviously more volatile. It is also more reactive; it converts to related diphenyl siloxanes at temperatures above about 140° C. Tetraphenyldisiloxanediol is the second smallest member of the silanol terminated diphenylsiloxane family.

The temperature to which the oven is heated is important, since the temperature must be hot enough to vaporize the organo silicon compound but not so hot that any component of the system or the wafer that is being treated will be damaged. It should be noted that a vacuum oven is used in some implementations of this invention. In addition, the time during which the heating process takes place is also a factor. Thus a relatively low temperature, which will cause a low rate of vaporization, will be acceptable if the heating step takes place over a relatively long period of time. Considering all of these factors, heating taking place between approximately 100° and 500° C. has been found to be acceptable, with the heating range being preferably between approximately 300° and 500° C. if the wafer, or other substrate, can tolerate this range. Many substrates are coated at lower temperatures (e.g., 100°-300° C.) due to limited thermal stability of elements contained on or in them.

Process issues as well as thermo-oxidative factors drive the focus towards silanol terminated polydiphenylsiloxanes. Most commercial siloxanes are based on dimethyl siloxanes (diphenyl siloxanes are relatively uncommon). However, silanols based on dimethyl siloxanes are unstable; they react even at room temperature in a condensation reaction that produces higher molecular weight products. The phenyl substituents stabilize silanol groups on diphenyl siloxanes. This stabilization effect allows silanol terminated polydiphenylsiloxanes to be used in a manufacturing environment.

Silanol terminated polydiphenylsiloxanes with average molecular weights up to approximately the 5000 range require little or no change from the process conditions described above. (This corresponds to n in the range of about 1-25; see FIG. 3. When n is greater than about 50, the compounds are not volatile at the specified temperature range.) The preferred range for n is approximately 4 to 25. After cooling, the wafers were removed and cut into chips, which were later assembled into packages. Although cerpacs and cerdips were used in this evaluation, other packages are equally applicable.

Most of the above discussion focused on processes for materials that have very low volatility at, or near, room temperature. However, the same principles and similar equipment can be applied for materials that exhibit moderate temperature volatility as explained in the following section.

Hexamethyldisilazane (HMDS) is commonly vapor deposited on wafers to enhance adhesion of photoresist to wafer surfaces. In this invention, it has the opposite effect: when applied in microstructures, it imparts anti-stiction properties. In order to take advantage of the anti-stiction properties of HMDS, it can be applied to either individual chips or to boat loads of wafers (before they are sawed into chips), by use of the same equipment that is commonly used to deposit HMDS for enhancing the adhesion of photoresist. This equipment is a vacuum oven, typically heated to 220°-250° C., with a reservoir that holds HMDS, which is a liquid at room temperature (FIG. 4 illustrates a modified form of such an oven). HMDS has an appreciable vapor pressure at room temperature so, when a valve that isolates the reservoir from the oven is opened, HMDS vapor flows into the oven and reacts with the hot wafer surfaces.

Wafers that are primed with HMDS are seldom stored for extended periods of time because the effectiveness of this treatment deteriorates with time. This is partially due to gradual evaporation of adsorbed material. Primary attributes of the treatments used in this invention are long term stability and durability. Achieving these qualities requires that more of the surface sites react and that adsorbed material be removed. This is accomplished by developing strong chemical bonds between the vapor deposited coating and the surface. Such reactions are promoted by increasing oven temperature and time during the deposition and bake-out portions of the process.

The above example used HMDS. However, similar equipment (perhaps with a heated reservoir and heat traced tubing) can be used to treat wafers with any organic, liquid or solid, that has moderate volatility. For example, as noted above, diphenylsilanediol decomposes above 140° C., but is quite stable near room temperature. Thus, this type of oven can be used with diphenylsilanediol (placed in the reservoir either neat, or in a solvent). Once in the hot oven, the diphenylsilanediol vapor reacts quickly with hot wafer surfaces to give a stable, low energy surface passivation.

In addition to the specific anti-stiction compounds disclosed above, it should be noted that mixtures of these compounds can be used as an anti-stiction agent. Considering the variety of anti-stiction compounds that can be used, the oven temperature can range from about 100°-500° C. In some cases, a particular material can be used over most or all of this temperature range. For example, this application cites specific data on diphenylsilanediol from 155° C. to 470° C. Other materials have practical low temperature limits due to low volatility. Below 300° C., for example, octaphenyl-cyclotetrasiloxane is essentially non-volatile. Characteristics of the wafer can also impose temperature limits. For example, a MEMS wafer with integrated CMOS (Complementary Metal Oxide Semiconductor) circuitry would be limited by the CMOS circuitry to processes below about 450° C. Wafers that contain optical MEMS mirrors can have an upper temperature limit that is set by diffusion of the thin films used to make the mirrors. With these limits properly considered, the above process results in a durable coating that lasts throughout chip manufacture and product life.

Several stiction tests were conducted. One class of tests applied an electrostatic force between adjacent microstructures to bring them into contact. Another set of tests applied mechanical shock. In all of these tests, stiction was substantially suppressed, and for practical purposes eliminated, by the anti-stiction treatment. Several examples illustrating the testing process are described below.

Stiction failures are the net effect of several forces. If surfaces come into contact, stiction can occur when:

Electrostatic force+Surface stiction forces>Mechanical spring restoring force  Eq. 1:

The objective of the anti-stiction treatment is to reduce surface forces to near zero. The devices in the first ADXL202 example described below (Example 2) were unpowered, so the electrostatic force in Eq. 1 is zero. The goal in this example is to reduce stiction force to a level such that the mechanical spring can always pull mated surfaces apart. The ADXL76 test in Example 3 illustrates the addition of an electrostatic force to the model while the second ADXL202 example in Example 4 combines both electrostatic force and cumulative wear. In these examples, the objective is to make the surface forces insignificant in comparison to the electrostatic and mechanical forces. Electrostatic attraction between conductors that are at different voltages is inversely proportional to the square of the distance that separates them. Therefore, if the anti-stiction treatment is applied at a significant thickness, one might expect it to reduce the electrostatic force term in Eq. 1 (after the two structures come into contact). This result would be expected because the separation distance between the conductors is the total thickness of the dielectric surface films when the structures are touching. Unfortunately, thick dielectric coatings support static charges. Such charges also cause stiction in some applications. Therefore, anti-stiction processes must form extremely thin, well controlled coatings if the coating is a dielectric.

This discussion described the anti-stiction treatment of a few wafers. However, one of the advantages of this process over the one described in '740 is that it can be used to treat several lots of wafers in a single process run. Thus, it has substantial economic and process control advantages.

The electrical characteristics of each chip can be measured and trimmed while they are still in wafer form. This has a significant cost advantage when compared to trimming after packaging. However, it requires that device performance be immune to packaging effects. This requirement has particular significance for microstructures that have electronic functionality because, unlike standard integrated circuit devices, microstructures are seldom passivated. The electrical behavior of microstructures that have unpassivated surfaces can be affected by gas adsorption onto these surfaces. Thus, a device which integrates circuitry with microstructures can exhibit undesirable behavior even though the portion of the chip which has standard semiconductor circuit elements is fully passivated. Package environments and exposure to room humidity affect some sensor designs while others are quite insensitive to packaging. Since the antistiction surface treatments described in this patent passivate the surface and are applied before the devices are trimmed, the final product can be produced with greater yield and tighter performance specifications.

The treatments described in this patent result in a thin dielectric layer on microstructures and other surfaces on the wafer. It is too thin to affect the wire bondability of aluminum bond pads on the wafer. A thin monolayer is sufficient to achieve anti-stiction and to control gas adsorption. The process and materials described in this patent increase the thickness of the dielectric native oxide which is present on silicon, polysilicon, aluminum and other materials used in semiconductor devices. However, the added thickness of this organic silicon oxide is typically only about 5-25 Angstroms, with most being in the 5-12 Angstrom thickness range. It is possible to vary the process and materials to increase the thickness. For example, low molecular weight fractions of silanol terminated polydiphenyl-siloxanes can be polymerized to form thicker layers when vapor deposited in this process. Thicknesses in excess of 100 Angstroms have been achieved. Thicker treatments can be deposited and are not harmful unless they interfere with wire bonding or form a dielectric that is sufficient to support electrical charges. Such charges affect electrical performance in an uncontrolled fashion, for example, electrostatic attraction arising from unwanted surface charges can move microstructures. The thickness measurements cited here can be made with any of several scanning ellipsometers on flat substrates.

Contact angle can also be used to detect the presence of these surface treatments. Water readily wets clean silicon dioxide surfaces giving a low wetting angle. A hydrophobic surface will not be wetted by water and has a high wetting angle. The surface treatments described here are all hydrophobic, so contact angle (as measured with a drop of water on the surface) is an easy way to check whether a coating is present. It is also a crude measure of coating quality. It indicates the presence of a hydrophobic coating, the degree of hydrophobicity and usually correlates with anti-stiction qualities. For example, water spreads out on clean silicon dioxide surfaces, producing a contact angle below 20 degrees. When treated as described in this patent, contact angles are typically above 80 degrees.

This invention covers a range of processes and materials that can be optimized to meet the requirements of a variety of microstructure applications. The following discussion illustrates some of the key factors involved in selecting the optimum materials and process characteristics. It further illustrates applications beyond anti-stiction coatings for inertial sensors.

1. Cyclic methyl and phenyl siloxanes are extremely stable. Cyclic phenyl siloxanes also exhibit very low volatility. As a result, cyclic siloxanes do not react with surfaces at low temperatures (they form only adsorbed layers). Raising the temperature sufficiently promotes reactivity. This occurs through the normal activation energy effect, an increase in vapor concentration and by the fact that the surfaces are activated due to thermal desorption of adsorbed gases. The result is a thin, well-controlled layer as determined by scanning ellipsometer measurements. Further reactions that would increase the thickness of the surface treatment beyond the initial layer do not appreciably occur because the initial treatment converts the surface into a low energy (non-chemically reactive) surface.

2. Stiction tests were conducted at several temperatures and times using silanol terminated polydiphenylsiloxane mixtures that had volatility levels which were similar to cyclic phenyl siloxanes. When compared at similar deposition conditions, these linear materials, with their reactive end groups, consistently gave better anti-stiction characteristics. Methoxy terminated polydiphenylsiloxanes and silanol terminated polydiphenylsiloxanes gave similar results. When the reactive end groups were eliminated (as with hexaphenyldisiloxane), the results were inferior. This confirms the importance of forming primary chemical bonds in a surface treatment where durable, stable performance is required.

3. Stiction testing of polysilicon microstructures treated with the cyclic phenyl siloxanes and silanol terminated polyphenylsiloxane described in Items 1 and 2 shows that the thermo-oxidative stability of these treatments increases with deposition temperature and time. Time-of-Flight SIMS and XPS analysis of these surfaces indicate that the added thermal exposure causes additional crosslinking to the surface.

4. Thickness control was still reasonably tight when silanol terminated polydiphenylsiloxane mixtures in the 800-5000 molecular weight range were used in place of the cyclic phenyl siloxanes. However, it becomes progressively easier to increase film thickness as the proportion of low molecular weight fraction of silanol terminated polydiphenylsiloxane is increased. This occurs because, once an initial bond is made at a surface, the reactive second end of the short (relatively rigid) linear diphenylsiloxane chain is exposed to the vapor where it can react with other molecules in the vapor. In contrast, the longer length of the higher molecular weight species increases conformability, thus increasing the probability that the free ends will react with the surface rather than with a molecule in the vapor. A second factor is that the longer molecules have a lower density of "free ends" per unit area of surface.

5. This application is partially based on depositions from cyclic diphenylsiloxanes. Some tests also used mixtures of these cyclics plus linear silanol terminated polydiphenylsiloxane. Comparisons show that the antistiction performance of these linear and cyclic precursors is not substantially different when it is measured on wafers. Packaged parts also show little difference if the packaging process does not use high temperature air. However, treatments based on cyclic diphenylsiloxanes are more susceptible to thermo-oxidation in the high temperature cerpac/cerdip assembly furnaces than those based on linear silanol terminated polydiphenylsiloxane. Therefore, use of pure linear material is desirable for cerdips and cerpacs. It is difficult to manufacture linear silanol terminated polydiphenylsiloxane that does not contain cyclic by-products. However, these cyclic-linear mixtures can be used to deposit coatings that approach the quality of coatings produced from pure linear material by applying a chemical reaction called hydrolysis. Silicones are very resistant to water. However, at the temperatures used in the polydiphenylsiloxane process (above approximately 200° C.), water rapidly hydrolyzes silicones. This reaction opens cyclic molecules and converts them to linear silanols. It also breaks long linear molecules into shorter molecules, thus promoting volatilization of species that might otherwise remain in the source container. CVD systems are designed to introduce gases such as steam into the process. Another simple technique is based on the fact that the silanol portions of silanol terminated polydiphenylsiloxane molecules are hydrophilic so they cause the material to absorb water from room air. Surface adsorption proceeds rapidly and is effective if particles are used (particles have high surface area). This adsorbed water when heated in intimate contact with the siloxane promotes in-situ hydrolysis during the deposition process (in the source boat, in the vapor and at the MEMS surface). The resulting silanols are more reactive than cyclic species so they produce surface treatments with enhanced resistance to thermo-oxidation. Note that addition of steam applies to both cyclic siloxanes and to cyclic-linear mixtures. However, adsorption is insignificant in silicones that do not contain hydrophilic substituents so this approach is not effective when the material is one of the pure cyclic siloxanes discussed above.

6. The 350°-500° C. process that is characteristic of the processes described in Items 1-5 is too high for many applications. To meet this issue, the use of organics with vapor pressures higher than cyclic and polymeric phenylsiloxanes can be used. Reactivity of the vapor can also be increased. These solutions are illustrated by the use of alkoxysilanes, HMDS, tetraphenyldisiloxanediol and by diphenylsilanediol. Obviously, non-silicon based organic materials can also be used. To illustrate low temperature extensions of this process, the ADXL76 deflection test described below in Example 3 was used to characterize performance of several low temperature materials on wafers that were taken from a single batch. All of the depositions exhibited good anti-stiction performance before packaging in cerpacs so they would be suitable for use in most packages. However, the methyl-rich surface produced by HMDS was substantially degraded in the cerpacs process. These devices had a deflection voltage of 5.7 volts, close to the value measured on devices that were assembled in cerpacs from an uncoated wafer from the same fab lot. Even in cerpacs, devices treated at 155° C. with diphenylsilanediol were quite acceptable (6.3 volts; 6.6 volts when the assembly furnace processes were carried out using air that was diluted with an inert gas to reduce the oxygen level to 3%), although not as good as the polydiphenylsiloxane controls that were deposited at 470° C. (7.5 volts when sealed in air). (See Examples.)

7. Reduction in the anti-stiction process temperature is particularly important in microstructure products that incorporate optical mirrors. Most such mirrors are formed by depositing a thin layer of gold onto a substrate. Gold does not adhere well to most surfaces so an adhesion layer, often chrome, is deposited before the gold. Exposure to the temperatures used in most hermetic package processes causes underlying materials (such as chrome) to diffuse through gold to mirror surfaces. Interdiffusion seriously degrades optical quality (i.e., reflectivity is reduced) so special barrier layers are often used to suppress interdiffusion. However, these barrier films must be carefully controlled to avoid deleterious film stresses. Diffusion effects are cumulative so the addition of another high temperature process is a serious concern. Successful production of optical products also requires tight control of thin film stresses but high temperatures processes make such control difficult and sometimes impossible. One result of uncontrolled film stresses can be microstructure warpage that degrades the performance of mirrors and interferometers. Interferometer performance is critically dependent on controlling refractive indices and optical path lengths. Obviously, path length control is compromised by microstructure warpage that affects the optical path. Fabry-Perot interferometers illustrate this need for well-controlled optical microstructures. These devices can be made from two "mirrors" that have low optical absorption (e.g., high optical transmission) and are separated by a cavity. One mirror is made from a set of thin film layers that form a suspended, normally movable, mirror that is aligned parallel to the wafer substrate. The second mirror can be the surface layers of the wafer substrate. Light incident on the suspended mirror experiences multiple reflections in the resonant cavity formed by the gap and these two mirrors. Thus, the mirror-gap-substrate combination creates constructive and destructive optical interferences at different wavelengths. The wavelengths that are reflected or transmitted change as the gap is increased or decreased. As a result, this type of interferometer exhibits optical transmission at selected wavelengths and optical reflection at other wavelengths. In summary, the ability to form anti-stiction surfaces at low temperatures considerably simplifies the manufacturing processes that are required to produce low stiction optical microstructures while minimizing diffusion and thin film stress shifts that degrade optical performance.

8. Electrical, biological and optical characteristics of the microstructure surface can all be controlled by deposition of materials with the appropriate composition. In the above examples, hydrophobic treatments were used to suppress surface adsorption and thus give better control of electrical characteristics, without creating a thick dielectric layer that would support surface charges. Thicker coatings and other physical and chemical properties have value in some applications. For example, coatings based on high phenyl materials give a relatively high optical refractive index while use of fluorinated or methyl precursors create low refractive index layers. In addition, biologically active components in coatings designed for biological applications are now possible because these organics can now be vapor deposited, assembled and packaged at moderate temperatures.

9. As noted above, the treatments described herein stabilize the electrical characteristics of surfaces. This is achieved by causing organic vapors to react with, and thus stabilize, local high energy sites on the surface. This passivating effect can also be illustrated by measuring oxide thickness as a function of time. Scanning ellipsometry is particularly convenient for this task. The initial thickness and the growth rate of oxide on silicon are both dependent on the specific process used to form the oxide. However, any of several processes will form 10-12 Angstroms of oxide on single crystal silicon. After one month of exposure to room air, this film typically appears to be 3-5 Angstroms thicker, and appears to grow another Angstrom in the following 1-3 months. Similar oxides that are treated in an organic vapor process as described herein, typically exhibit only 0.5 Angstroms of growth after several months. This difference is due to the fact that untreated, high energy oxide surfaces adsorb moisture and other gases from ambient air. Thus, most of the "apparent" oxide growth is actually a buildup of adsorbed material. In contrast, the surfaces of the vapor treated oxides are in a low energy, unreactive state. Therefore, they have little tendency to attract and hold adsorbed gases.

10. The above text discusses vapor deposition of thin organic coatings onto oxidized silicon and oxidized polysilicon. However, the technology is applicable to a wide variety of substrates as illustrated by deposition of similar coatings on an aluminum alloy, single crystal germanium and freshly etched (oxide-free) silicon. Wavelength scanning ellipsometry was used to characterize the coating thickness on the aluminum alloy and the oxide-free etched silicon. Wire bonding experiments on aluminum bond pads confirmed that the coating, although present, is too thin to affect wire bond yield and reliability, even though X-ray photoelectron spectroscopy (XPS) measurements suggest that depositions on aluminum have slightly greater coverage than those on silicon oxides. Attenuated Total Reflectance was used to compare the infrared characteristics of films deposited on germanium, oxide-free silicon and oxidized single crystal silicon. Similar absorption peaks were identified in the coatings that formed on all three materials.

The following examples are intended to illustrate, not limit, the invention described herein.

EXAMPLE 1

Process for Coating a Wafer

Wafers were coated with octaphenylcyclotetrasiloxane (a solid cyclic silicone) for evaluation. Several grams of this solid silicone were weighed into a small container. Both the solid silicone and the wafers were placed in an oven (either a CVD furnace tube or a programmable box oven or a vacuum evaporator can be used) and heated to between about 300°-about 500° C. (preferably about 470°-485° C.). As the temperature is increased, the oven may be evacuated and backfilled with an inert gas to enhance removal of adsorbed materials from the surface. Several evacuation and backfill cycles may be used to enhance heat transfer and thus minimize temperature non-uniformity. Nitrogen is a convenient inert gas for this purpose. As temperature rises, the silicone volatilizes, contacts the wafers and reacts to form thin films on the wafer surfaces. Chemical reactivity of the surface is increased when adsorbed material is removed. Elevated temperature increases both reactivity and vapor concentration. All three of these factors enhance the reaction rate between the surface and molecules in the vapor. This can be critical because many materials, like octaphenylcyclotetrasiloxane, are relatively inert. Therefore, highly reactive surface conditions are required in order to promote reactions that permanently anchor such materials to the surface. The high temperature deposition portion of the process can be conducted either in the inert gas or in vacuum. In this example, the vapor pressure of octaphenyl-cyclo-tetrasiloxane is about one Torr at 330° C., so practical production rates require that the deposition temperature be in the 300°-500° C. range. Below 300° C., the deposition rate is too low. The upper temperature limit is set by factors related to the wafer (such as the aluminum metallization) and by the thermal degradation rate of the silicone. Wafer-to-wafer and within wafer temperature uniformity are key limitations to the temperature ramp rate. Residence time near the maximum temperature may range from a minute to over an hour (preferably about 25-45 minutes). Other cyclic siloxanes like hexaphenylcyclotrisiloxane materials have been used in this process but non-cyclic molecules can also be deposited. For example, silanol terminated polydiphenyl-siloxanes are linear siloxanes that have been found to be particularly effective used by themselves and in combination with cyclic siloxanes.

EXAMPLE 2

Testing the ADXL202 Accelerometer

The ADXL202 is a bi-axial accelerometer that is often packaged in cerpacs and is designed to measure acceleration up to a nominal level of 2 g. Part of the ADXL202 microstructure consists of a polysilicon inertial mass that is supported by eight polysilicon springs. The springs are folded (this increases mechanical compliance by increasing spring length in the confined space). If discrete (before mounting on a circuit board) ADXL202 cerpacs are packaged without an anti-stiction treatment, and then dropped onto a hard surface, the suspended microstructure will contact adjacent surfaces. An ADXL202 manufactured in this manner would sometimes stick so an anti-stiction treatment is essential. A convenient way to quantify stiction is to drop cerpacs through a tube until they hit a hard surface. Several hard surfaces including granite have been used. The tube keeps the cerpac aligned in one axis to ensure a more consistent test. When they hit, the ceramic packages transmit mechanical shock to the chips, causing the spring mounted microstructures to slam into adjacent surfaces. In the ADXL202, a twelve inch (30.5 cm.) tube is sufficient to cause hard contact and failure when no anti-stiction treatment is applied. The application of an anti-stiction material prevents this failure. Over 8000 drops were made using cerpacs containing chips from 25 wafers that had been treated in a box oven with silanol terminated polydiphenyl-siloxane in nitrogen. Another 3000 drops were made using chips from 12 wafers that were vacuum treated in the same oven with the same material. None of the treated ADXL202 devices exhibited stiction failure.

EXAMPLE 3

Testing the ADXL76 Accelerometer

The ADXL76 is a single axis accelerometer that is designed for air bag applications. It has a nominal design range of 50 g. The circuit allows for a special test mode that generates an electrostatic force between the fixed fingers and fingers that are part of the spring mounted inertial mass (see FIG. 1). This application of electrostatic force is termed the "deflection test". Devices with no anti-stiction treatment can be made to stick when the surfaces contact, a condition generated with a "deflection voltage" less than 5 volts. Application of an anti-stiction treatment such as one described in '740 typically raises the deflection voltage to 5.5 volts. This is sufficient to eliminate stiction induced field failures. Tests conducted on cerpacs built with chips from 14 wafers that were coated in a box oven with silanol terminated polydiphenylsiloxane and nitrogen cover gas gave a typical deflection voltage of 7.6 volts. Parallel tests on cerpacs built from 14 wafers that had been vacuum coated with the same material in a CVD tube had an average deflection voltage of 8.9 volts. In another box oven test, diphenylsilanediol and silanol terminated polydiphenylsiloxane were compared in the same 470° C. process. Under the test conditions, stiction could not be induced in most of the diphenylsilanediol and some of the polydiphenylsiloxane devices (average deflection voltage was 7.8 volts in this polydiphenylsiloxane treated lot).

EXAMPLE 4

Stiction and Wear Life Testing in Accelerometers

Both stiction and wear life of the surface treatments used on ADXL202 accelerometers have been evaluated in cerpacs. The test combines a "deflection test" with repeated mechanical impacts. This technique characterizes the durability of surface treatments in a simulated wear test. It was used to show that the antistiction performance of devices treated with mixtures of polydiphenylsiloxane and cyclic diphenylsiloxanes, and packaged in cerpacs, improves as the deposition temperature is raised up to the limit set by the aluminum interconnects on the wafer (about 485° C.).

EXAMPLE 5

Testing Devices From ADXL110 Wafers

To illustrate electrical passivation with an anti-stiction treatment, three ADXL110 wafers were treated with silanol terminated polydiphenylsiloxane along with two control wafers from the same lot. The ADXL110 is a closed loop single axis accelerometer designed for air bag applications. Each device on the wafer is trimmed to produce a set millivolt output when it is powered and not exposed to acceleration forces ("zero-g voltage"). Three weeks after trimming, the wafers were re-probed to see whether device characteristics had shifted due to aging in clean room air. The standard deviation of zero-g voltage measured on chips in the untreated wafers was double the value measured on the treated wafers, thus indicating that the anti-stiction treatment maintained electrical uniformity better than was observed in chips on the untreated control wafers. This stabilization effect was even more evident when the mean values of zero-g voltage were compared.

Further variations of the above invention will be recognized by those with skill in the relevant art.

What is claimed is:

1. A method for producing microelectromechanical devices comprising the steps of:
    inserting a wafer having a plurality of microelectromechanical devices fabricated on a surface thereof into one of an oven or a furnace;
    heating a compound having anti-stiction properties within said oven or furnace to a temperature sufficient to vaporize said compound;
    depositing said vapor on said wafer surface so as to treat the surface of said wafer with said compound;
    removing said wafer from said oven or furnace; and
    sawing said treated wafer to form a plurality of microelectromechanical devices having a device surface treated with said anti-stiction compound, wherein said depositing step is carried out before said sawing step.

2. A method for producing microelectromechanical devices from a wafer comprising the steps of:
    heating a compound operative to imparte anti-stiction properties to a temperature sufficient to vaporize said compound, said compound having organic content;
    depositing said vapor on a surface of the wafer having a plurality of microelectromechanical devices fabricated thereon so as to treat the surface of said wafer with said compound; and
    separating said plurality of microelectromechanical devices on said treated wafer into discrete devices, wherein said depositing step is carried out before said separating step.

3. The method of claim 2, wherein said depositing step comprises the step of coating said surface to a thickness of between 5-100 Angstroms.

4. The method of claim 2, wherein said depositing step comprises the step of treating said surface with a compound effective to passivate said surface.

5. The method of claim 2, wherein said treatment imparts hydrophobic properties to the plurality of microelectromechanical devices.

6. The method of claim 2, wherein said treatment reduces the surface energy of the surfaces of the plurality of microelectromechanical devices.

7. The method of claim 2, wherein said treatment imparts a biologically active surface to the plurality of microelectromechanical devices.

8. The method of claim 2, said method resulting in an organo-metallic surface on the plurality of microelectromechanical devices.

* * * * *

UNITED STATES PATENT AND TRADEMARK OFFICE
CERTIFICATE OF CORRECTION

PATENT NO. : 7,364,942 B2  Page 1 of 1
APPLICATION NO. : 11/786515
DATED : April 29, 2008
INVENTOR(S) : John R. Martin It is certified that error appears in the above-identified patent and that said Letters Patent is hereby corrected as shown below:

Column 6, line 7, "(Wafer Anti-Stiction Agent)" should read -- (<u>W</u>afer <u>A</u>nti-<u>S</u>tiction <u>A</u>gent) --.

Signed and Sealed this

Seventh Day of April, 2009

JOHN DOLL
*Acting Director of the United States Patent and Trademark Office*